(12) United States Patent
van der Heijden (10) Patent No.: US 9,444,421 B2
(45) Date of Patent: Sep. 13, 2016

(54) COMBINER CIRCUIT FOR A CLASS-E OUTPHASING POWER AMPLIFIER

(71) Applicant: Ampleon Netherlands B.V., Nijmegen (NL)

(72) Inventor: Mark Pieter van der Heijden, 's-Hertogenbosch (NL)

(73) Assignee: Ampleon Netherlands B.V., Nijmegen (NL)

(*) Notice: Subject to any disclaimer, the term of this patent is extended or adjusted under 35 U.S.C. 154(b) by 135 days.

(21) Appl. No.: 14/444,736

(22) Filed: Jul. 28, 2014

(65) Prior Publication Data

US 2015/0048899 A1    Feb. 19, 2015

(30) Foreign Application Priority Data

Aug. 14, 2013    (EP) .................................... 13180416

(51) Int. Cl.

| | | |
|---|---|---|
| H03H 7/38 | (2006.01) | |
| H03F 3/68 | (2006.01) | |
| H03F 1/02 | (2006.01) | |
| H03F 1/56 | (2006.01) | |
| H03F 3/217 | (2006.01) | |
| H03H 7/46 | (2006.01) | |

(52) U.S. Cl.
CPC .............. *H03F 3/68* (2013.01); *H03F 1/0294* (2013.01); *H03F 1/565* (2013.01); *H03F 3/2176* (2013.01); *H03H 7/463* (2013.01); *H03F 2200/387* (2013.01); *H03F 2200/391* (2013.01); *H03F 2203/21139* (2013.01)

(58) Field of Classification Search
CPC ........ H03F 3/68; H03F 1/0294; H03F 1/565; H03F 3/2176

USPC .................................. 333/124–129, 132, 134
See application file for complete search history.

(56) References Cited

U.S. PATENT DOCUMENTS

| | | | | |
|---|---|---|---|---|
| 5,903,827 A | * | 5/1999 | Kennan ................... | H01P 5/222 333/120 |
| 5,939,939 A | * | 8/1999 | Gaynor ..................... | H01P 5/12 330/124 R |
| 7,696,841 B2 | * | 4/2010 | Chen ......................... | H03F 1/56 330/295 |
| 7,800,442 B2 | * | 9/2010 | Lejon ..................... | H03F 1/0294 330/124 R |
| 7,893,762 B2 | * | 2/2011 | Hellberg ................ | H03F 1/0288 330/124 R |
| 8,174,322 B2 | * | 5/2012 | Heijden ................ | H03F 1/0294 330/124 R |
| 8,203,386 B2 | * | 6/2012 | van der Heijden ... | H03F 1/0294 330/124 R |
| 2012/0139640 A1 | | 6/2012 | Calvillo Cortes et al. | |

OTHER PUBLICATIONS

Beltran, Ramon et al; "HF Outphasing Transmitter Using Class-E Power Amplifiers"; IEEE Microwave Symposium Digest, 2009, Jun. 7-12, 2009; Boston MA, USA; pp. 757-760 (2009).

(Continued)

*Primary Examiner* — Robert Pascal
*Assistant Examiner* — Kimberly Glenn
(74) *Attorney, Agent, or Firm* — McDonnell Boehnen Hulbert & Berghoff LLP (57) ABSTRACT

Lumped-element based class-E Chireix combiners are disclosed that are equivalents of a quarter-wave transmission line combiner. The proposed class-E equivalent power amplifier circuits that are used can be derived from a parallel tuned class-E implementation. The proposed low-pass equivalents can behave similarly in terms of class-E performance, but absorb the 90 degree transmission line.

9 Claims, 5 Drawing Sheets

(56) References Cited

OTHER PUBLICATIONS van der Heijden, Mark P. et al; "A 19W High-Efficiency Wide-Band CMOS-GaN Class-E Chireix RF Outphasing Power Amplifier"; Microwave Symposium Digest, 2011 IEEE MTT-S International, Jun. 5-10, 2011, Baltimore, MD, USA; pp. 1-4 (2011).
Calvilo-Cortes, David A, et al; "A 70W Package-Integrated Class-E Chireix Outphasing RF Power Amplifier"; Microwave Symposium Digest (IMS), 2013 IEEE MTT-S International, Jun. 2-7, 2013; Seattle, WA, USA; pp. 1-3 (2013).
van der Heijden, Mark P. et al; "A Package-Integrated 50W High-Efficiency RF CMOS-GaN Class-E Power Amplifier"; Microwave Symposium Digest, 2013 IEEE MTT-S International, Jun. 2-7, 2013; Seattle, WA, USA; pp. 1-3 (2013).
Thian, M et al: "Power combining Techniques into Unbalanced Loads for Class-E and Inverse Class-E Amplifiers"; IET Microwaves, Antennas & Propagation, 10 pages (Mar. 26, 2008).
Lee, Sungho et al; "A CMOS Outphasing Power Amplifier with Integrated Single-Ended Chireix Combiner"; IEEE Transaction on Circuits and Systems II: Express Briefs, vol. 57, Issue 6; pp. 411-415 (Jun. 14, 2010).
Rembold, B et al; "Power Combiner for LINC Amplifier"; Electronics Letters, vol. 41, No. 25; 2 pages (Dec. 8, 2005).
Extended European Search Report for Application 13180416.3 (Nov. 7, 2013).

\* cited by examiner

COMBINER CIRCUIT FOR A CLASS-E OUTPHASING POWER AMPLIFIER

CROSS-REFERENCE TO RELATED APPLICATIONS

This application claims the priority under 35 U.S.C. §119 of European patent application no. 13180416.3, filed on Aug. 14, 2013, the contents of which are incorporated by reference herein.

This invention relates to class-E outphasing power amplifiers. In particular, it relates to providing a Chireix combiner for such an amplifier.

In the past, the implementation of the Chireix outphasing combiner was usually based on quarter-wave transmission lines (QWTL). More recently, implementations based on transformers have been proposed. Another alternative uses a combiner based on lumped-element T networks to replace the transmission lines.

All of these approaches have drawbacks. With the QWTL solution, the efficiency depends both on the outphasing angle and on frequency, since both the Chireix compensation elements and the QWTL are frequency dependent. This is highly undesirable for a wideband transmitter. Some transformer-based approaches rely on bond wires for implementing the transformer structures. The performance of these transformers depends upon achieving the desired amount of magnetic coupling between parallel bond wires. The amount of coupling is sensitive to process variations, which makes fabrication of these structures challenging, expensive and/or unreliable, potentially leading to low production yield. Other transformer-based approaches rely on printed circuit board (PCB) transmission lines to implement the transformer structures. Although this can improve accuracy during fabrication, these implementations use bare-die technology and a multi-layer RF circuit-board to create the combiner. This can make them expensive and/or difficult to assemble. A lumped element structure proposed by Beltran et al. (Ramon Beltran, Frederick H. Raab, and Arturo Velazquez, "HF outphasing transmitter using class-E power amplifiers," IEEE MTT-S Digest, pp. 757-760, June 2009) involves a series resonator (a combination of L and C elements in series between the input and the output of the combiner). This is difficult to implement with high quality inside a semiconductor package. The circuit also requires a large number of lumped element components (inductors, L, and capacitors, C).

According to a first aspect of the present invention, there is provided a combiner circuit for a class-E outphasing power amplifier comprising first and second branch amplifiers, the combiner circuit comprising:

a first input node, for receiving the output signal of the first branch amplifier;

a second input node, for receiving the output signal of the second branch amplifier; and an output node, for supplying a combined output signal to a load;

a first inductor ($L_E$) connected in series at the first input node, the first inductor having an input terminal connected to the first input node and an output terminal;

a second inductor ($L_E$) connected in series at the second input node, the second inductor having an input terminal connected to the second input node and an output terminal;

a compensation inductor ($L_{CHIR}$) connected in series with the first inductor and directly connected to the output node; and a compensation capacitor ($C_{CHIR}$) connected in series with the second inductor and directly connected to the output node.

This circuit provides suitable class-E impedance terminations for load modulation and Chireix compensation elements. It comprises a relatively small number of circuit elements and is suitable for integration inside a transistor package. This is achieved by absorbing the functions of both the class-E elements and the Chireix compensation elements in small number of elements that fulfil both functions. The combiner circuit is derived by converting a parallel tuned class-E implementation to a low-pass equivalent circuit. The proposed equivalent circuit behaves similarly, in terms of class-E performance, and absorbs the quarter-wavelength transmission line. The low-pass section can provide an advantage in terms of package integration, since it may no longer be necessary to implement a series resonant circuit inside the package. This attribute, together with the small number of components required can potentially lead to higher yield, lower assembly complexity, and lower cost.

With the combiner circuit of the first aspect, the Chireix compensation elements are provided at the output of the low-pass sections. This potentially avoids the need to implement a parallel (shunt) inductance, because the essential inductors are in a series arrangement.

The compensation inductor provides a Chireix compensation inductor; and the compensation capacitor provides a Chireix compensation capacitor.

The combiner circuit may further comprise: a first capacitor ($C_E$), with one terminal connected to the output terminal of the first inductor and the other terminal connected to ground; and a second capacitor ($C_E$), with one terminal connected the output terminal of the second inductor and the other terminal connected to ground.

The first inductor and first capacitor form a class-E low-pass equivalent for the first branch amplifier. The second inductor and second capacitor form a class-E low-pass equivalent for the second branch amplifier.

The second capacitor and the compensation capacitor may be implemented as Metal-Insulator-Metal capacitors together on a single die.

This MIMcap structure combines a shunt capacitor (the second capacitor) and a series capacitor (the compensation capacitor)

The compensation inductor ($L_{CHIR}$) may be directly connected to the output terminal of the first inductor; and the compensation capacitor ($C_{CHIR}$) may be directly connected to the output terminal of the second inductor.

The combiner circuit optionally further comprises a connection at the output terminal of the second inductor for connecting a DC-bias supply.

This provides an arrangement for supplying the second branch amplifier with a DC-lead. The DC supply may be connected via a bias network. The bias network preferably functions as an open circuit at the desired RF frequency of operation and functions as a low-ohmic resistance for the DC and modulation frequency band (typically in the range 0 Hz-100 MHz). The bias network may include an inductor or RF choke, preferably comprising a ferromagnetic core.

According to a second aspect of the invention, there is provided a combiner circuit for a class-E outphasing power amplifier comprising first and second branch amplifiers, the combiner circuit comprising:

a first input node, for receiving the output signal of the first branch amplifier;

a second input node, for receiving the output signal of the second branch amplifier; and an output node, for supplying a combined output signal to a load;

a first inductor (L, $L_E$) connected in series at the first input node, the first inductor having an input terminal connected to the first input node and an output terminal;

a second inductor (L, $L_E$) connected in series at the second input node, the second inductor having an input terminal connected to the second input node and an output terminal; and a compensation inductor ($L_{CHIR}$, $L_{CHIR2}$) connected in shunt between the second input node and ground.

The combiner circuit of the second aspect was designed using similar principles and has similar advantages to the first aspect, discussed already above.

The combiner circuit may further comprise a first capacitor ($2C_E$, 2C, $C_E$) connected in shunt between the output node and ground.

The combiner circuit may further comprise a compensation capacitor ($C_{CHIR}$) connected in shunt between the first input node and ground.

With this arrangement, the Chireix compensation elements (compensation capacitor and compensation inductor) are placed in shunt to the input ports of the class-E combiner.

This arrangement may reduce the values of inductances needed in the circuit, compared with some other arrangements. In the case that the inductances are implemented as bond wires, this may mean that the bond wires can be shorter, potentially making assembly easier and/or increasing yield.

The combiner circuit may further comprise a further compensation inductor ($L_{CHIR1}$) connected in series with the first inductor and directly connected to the output node.

This arrangement may avoid the need for a shunt capacitor at the first input node. It may simultaneously avoid the need for long bond wires (in implementations where inductors are implemented using bond wires).

The compensation inductor may be implemented by bond wires or by a track on a PCB.

The combiner circuit may further comprise: a second capacitor ($C_E$), with one terminal connected to the output terminal of the first inductor and the other terminal connected to ground.

The further compensation inductor ($L_{CHIR1}$) may be directly connected to the output terminal of the first inductor.

Each of the capacitors and/or inductors is preferably implemented as a lumped element component.

Preferably, one or more of the capacitors are implemented as Metal-Oxide-Semiconductor capacitors; and/or one or more of the inductors are implemented as bond wires.

The combiner circuit may further comprise a matching circuit between the output node and the load.

Each branch amplifier preferably comprises a power transistor.

Also provided is a class-E outphasing power amplifier module, comprising: first and second branch amplifiers; and a combiner circuit as summarised above, arranged to combine the output signals of the branch amplifiers.

Preferably, the first and second branch amplifiers and the combiner circuit are integrated in a single physical package. The package may comprise a metal header and a ceramic or plastic lid, enclosing at least one transistor die, at least one passive die (for example, providing Metal-Oxide-Semiconductor capacitors), and bondwires. The dies are typically soldered to the package.

The invention will now be described by way of example with reference to the accompanying drawings, in which.

Embodiments of the present invention can provide lumped-element based class-E Chireix combiners that are an equivalent of the quarter-wave transmission line combiner. In contrast with the solutions proposed by Beltran et al., these circuits can absorb both the class-E and Chireix compensation elements in a compact structure that can be package-integrated and has potentially higher yield (lower assembly complexity) and lower cost.

The proposed class-E equivalent power amplifier circuits that are used in the embodiments described below can be derived from a classical parallel tuned class-E implementation. The proposed low-pass equivalent behaves similarly in terms of class-E performance, but absorbs the 90 degree transmission line, since the low-pass section has a similar phase response at its resonance frequency as compared to the circuit shown in FIG. 5 of Beltran et al. The low-pass section has a major advantage in terms of package integration, since it can avoid the need to implement a series resonant circuit inside the package.

Figure 1:
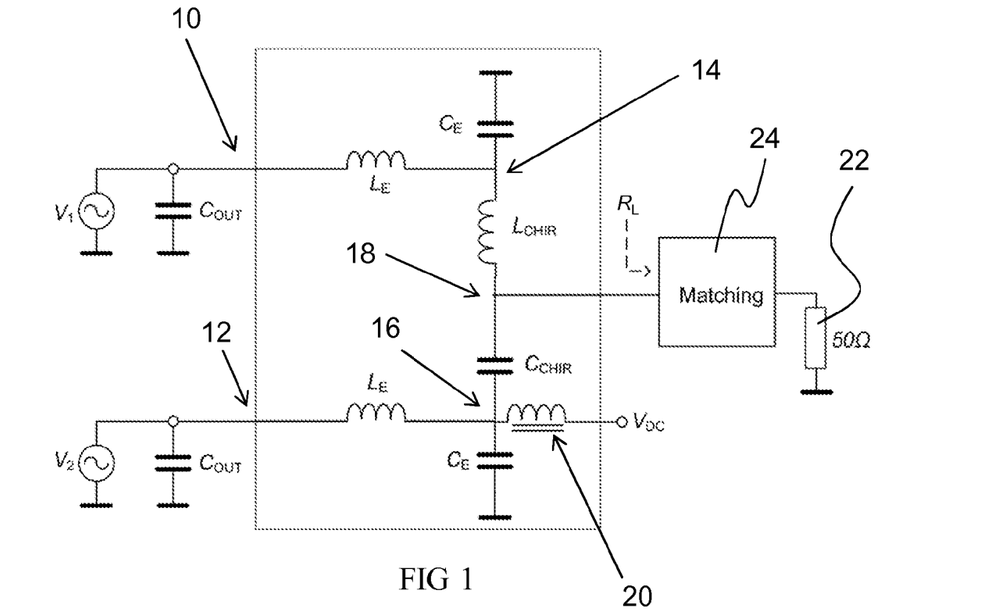
FIG. 1 is a circuit-diagram showing a combiner according to an embodiment of the first aspect of the invention.

An embodiment of the first aspect of the invention will now be described, with reference to FIGS. 1 to 3. FIG. 1 shows a circuit diagram of this embodiment. There are two branch amplifiers, each comprising a power transistor. In the circuit diagram, the power transistor of the first branch amplifier is modelled by voltage source $V_1$ and a shunt capacitance $C_{OUT}$. Similarly, the power transistor of the second branch amplifier is modelled by voltage source $V_2$ and a shunt capacitance $C_{OUT}$. The combiner circuit has a first input node 10, for receiving the output signal of the first branch amplifier; and a second input node 12, for receiving the output signal of the second branch amplifier. At the output side, there is an output node 18, for supplying a combined output signal to a load 22. Between the output node 18 and the load 22 an impedance-matching network 24 is provided.

The combiner circuit includes a first inductor $L_E$ connected in series at the first input node 10. This first inductor has an input terminal connected to the first input node 10 and an output terminal 14. A second inductor $L_E$ is connected in series at the second input node 12. This second inductor has an input terminal connected to the second input node 12 and an output terminal 16. A Chireix compensation inductor $L_{CHIR}$ is connected in series with the first inductor, at its output terminal 14. The other terminal of the compensation inductor is directly connected to the output node 18. Meanwhile, a Chireix compensation capacitor $C_{CHIR}$ is connected in series with the second inductor, at its output terminal 16.

The other terminal of the compensation capacitor is directly connected to the output node 18. A first capacitor $C_E$ is connected in shunt at the output of the first inductor, One terminal of the capacitor is connected to the output terminal 14 of the first inductor and the other terminal connected to ground. A second capacitor $C_E$ is connected in shunt at the output of the second inductor. One terminal of the capacitor is connected to the output terminal 16 of the second inductor and the other terminal connected to ground. The first and second capacitors $C_E$ and first and second inductors $L_E$ provide the low-pass equivalent for constructing a class-E amplifier.

The output terminal 16 of the second inductor $L_E$ is connected via a ferromagnetic core inductor 20 to a DC-bias supply $V_{DC}$. This provides a DC supply to the second branch amplifier. The ferromagnetic core is one example of a bias network which functions as an open circuit at the desired RF frequency of operation and functions as a low-ohmic resistance for the DC and modulation frequency band (in this case, in the range 0 Hz-100 MHz). The DC supply to the first branch amplifier is not shown in the diagram but can be provided in a conventional manner. For example, it can be implemented on the PCB board in the RF output path by conventional bias techniques with the same requirements in terms of impedance as for the second branch amplifier.

The various component values can be found using the following formulas:

$$L_E = \frac{1}{\omega_0^2 q^2 C_{OUT}} \quad R_L = \frac{Z_{0E}^2}{2R_E} \quad C_{CHIR} = \frac{1}{\omega_0 R_L \sin 2\theta_C}$$

$$C_E = \frac{1}{\omega_0^2 L_E} \quad Z_{0E} = \sqrt{\frac{L_E}{C_E}} \quad L_{CHIR} = \frac{R_L}{\omega_0} \sin 2\theta_C$$

Here, $L_E$, $C_E$, and $R_E$ are the optimum class-E element values and $\omega_0$ is the desired RF resonance frequency. For load-modulation or outphasing, the quality factor, q, is 1.3. $R_E$ is the optimum class-E load resistance presented at the drain of the transistor. For q=1.3, it is approximately $R_E$=0.585/($\omega_0 * C_{OUT}$). This was shown, for example, in M. P. van der Heijden, et al., "A 19 W high-efficiency wide-band CMOS-GaN class-E Chireix RF outphasing power amplifier," IEEE MTT-S IMS Digest, June 2011. The angle, $\theta_c$, used to determine the Chireix compensation component values is given by:

$$\theta_c = \arccos(10^{-BO/20})$$

where BO is the back-off level for efficiency peaking. The back-off level is referenced in dB from the peak power level and defines where the efficiency peak occurs relative to the peak power of the Chireix outphasing power amplifier.

In the classical class-E approach, an L-C series network forms a resonator. For reasonable loaded quality factors required for class-E (>5) this can result in excessive voltage swings across the capacitor, which can lead to voltage breakdown or high series resistive losses, in practice. Although there is a series capacitor $C_{CHIR}$ in the present embodiment, it is not used in a resonant circuit. The actual voltage swings are quite moderate and don't result in a reliability issue or high losses, when assuming a realistic quality factor for the component.

The present embodiment has the Chireix compensation elements transformed to the output of the low-pass sections. This avoids the need to implement a parallel inductance for the second branch amplifier, which may be an advantage.

Figure 2:
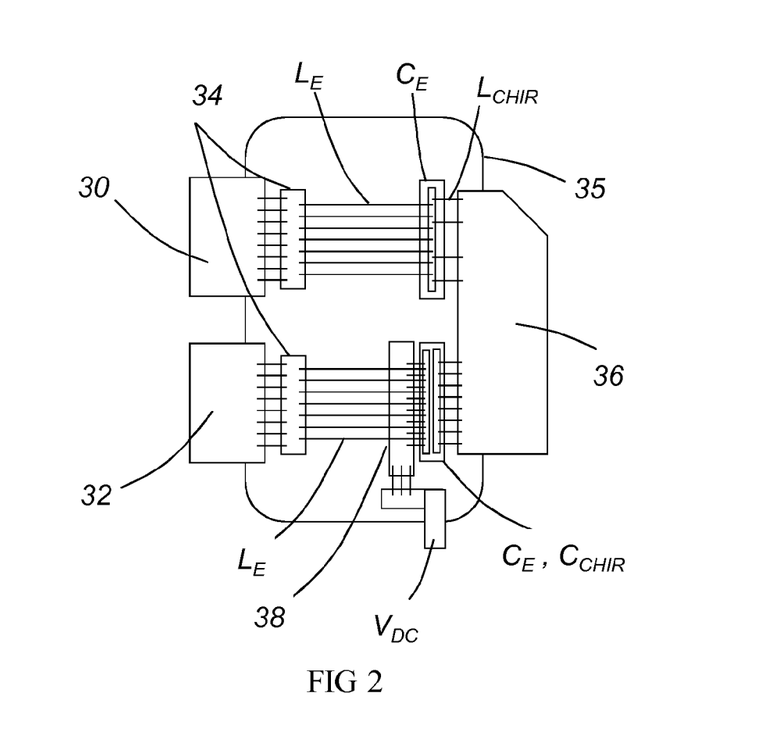
FIG. 2 is a schematic diagram illustrating a practical embodiment of the combiner of FIG. 1.

A practical implementation of the circuit of FIG. 1 is illustrated schematically in FIG. 2. This shows a module which incorporates the two power transistors 34 for the respective branch amplifiers, as well as the combiner circuit. Two input leads 30 and 32 are provided, for receiving the signals to be amplified by the first and second branch amplifiers, respectively. These inputs 30 and 32 are connected to the respective power transistors 34 by bond wires (indicated by black lines in FIG. 1). The class-E inductors $L_E$ are implemented as bond wires connecting the power transistors 34 to the class-E capacitors $C_E$. The first capacitor $C_E$ is connected by a further set of bond wires to the output lead 36. These bond wires form the Chireix compensation inductor $L_{CHIR}$. In the second branch, the second capacitor $C_E$ (connected in shunt) and the Chireix compensation capacitor $C_{CHIR}$ (connected in series) are implemented together as Metal-Insulator-Metal capacitors (MIMcaps) on a single die. A PCB insert 38 is connected to the MIMcap structure by more bond wires. This is used for the DC bias connection via a sense lead (labelled $V_{DC}$ in FIG. 2).

The discrete capacitors are implemented as silicon Metal-Oxide-Semiconductor capacitors (MOScaps). The entire module is enclosed in a package 35, consisting of a metal header and a ceramic or plastic lid in which the transitor die, passive die (MOScap) and bondwires are enclosed. The dies are soldered to the package. The metal header is made of copper in the present exemplary implementation but could be made of other metals, such as a copper-tungsten alloy.

Figure 3:
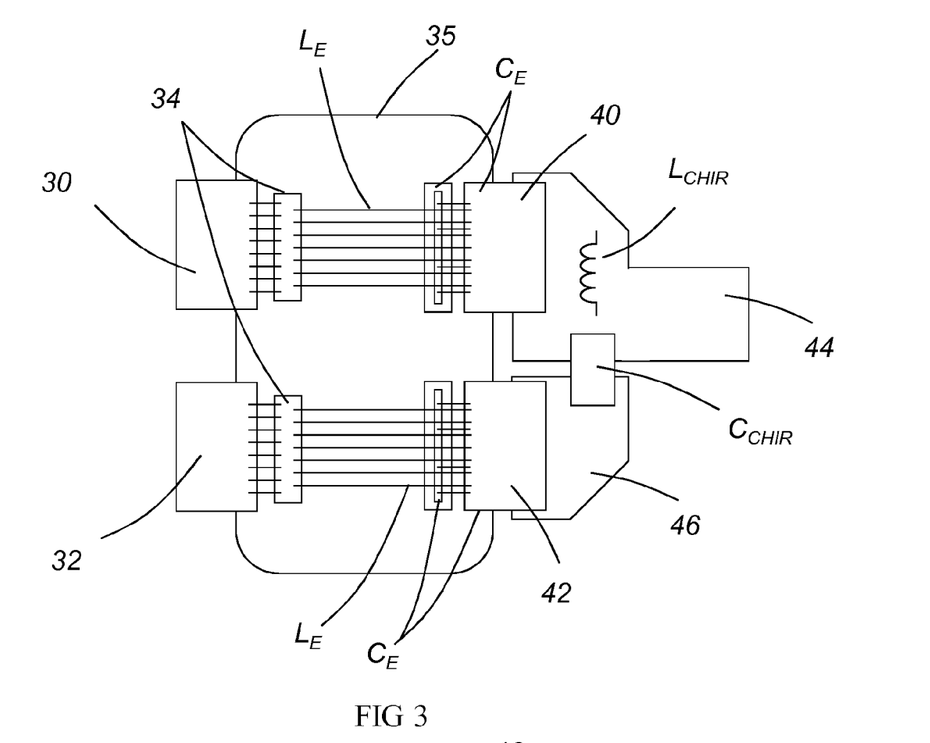
FIG. 3 is a schematic diagram illustrating an alternative practical embodiment of the combiner of FIG. 1.

An alternative practical implementation of the circuit of FIG. 1 is shown schematically in FIG. 3. Like elements are labelled with like reference signs. In this implementation, instead of providing the second capacitor $C_E$ and the Chireix compensation capacitor $C_{CHIR}$ together in a MIMcap structure, a dual input-lead, dual output-lead module is used and the series Chireix compensation inductor $L_{CHIR}$ and Chireix compensation capacitor $C_{CHIR}$ are implemented outside the module. Consequently, the output leads 40 and 42 of the module no longer correspond to the output node of the combiner circuit. The first and second class-E capacitors are connected to the output leads 40 and 42, respectively. The capacitances of these capacitors is adjusted to take into account the capacitance of the leads 40 and 42, so that the combined capacitance of the capacitor and the lead amounts to the desired value of $C_E$, in each case. The compensation inductor is implemented by the inductance of a PCB track 44 which now forms the output node of the combiner circuit. This PCB track 44 is connected to the first output lead 40 of the module. A second PCB track 46 is connected to the second output lead 42.

The compensation capacitor $C_{CHIR}$ is implemented as a surface mount device (SMD), which is connected between the first and second PCB tracks 44 and 46.

Figure 4:
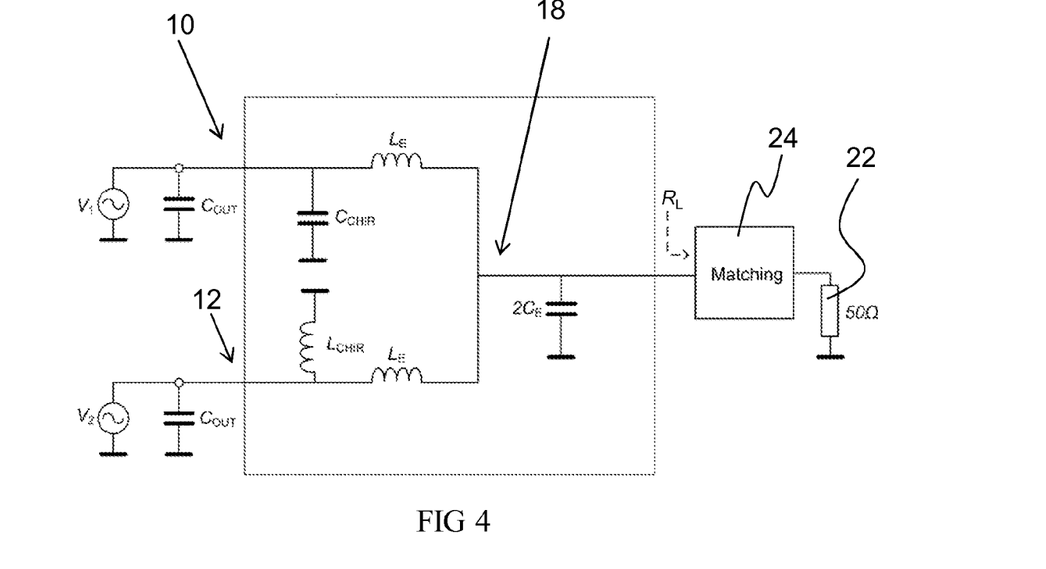
FIG. 4 is a circuit-diagram showing a combiner according to a first embodiment of the second aspect of the invention.
Figure 5:
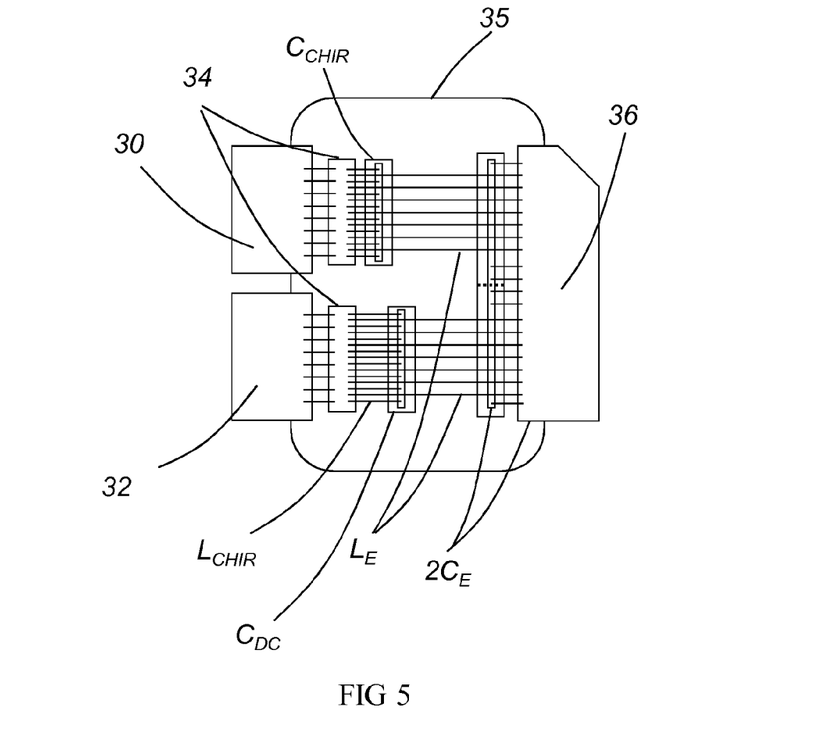
FIG. 5 is a schematic diagram illustrating a practical embodiment of the combiner of FIG. 4.

A first embodiment of the second aspect of the invention will now be described, with reference to FIGS. 4 and 5. FIG. 4 shows a circuit diagram and FIG. 5 shows a schematic diagram of a practical implementation. The basic underlying structure of this circuit is similar to that of the first aspect of the invention, so the following description will concentrate on the differences.

This combiner circuit has a first inductor $L_E$ connected in series at the first input node 10, with an input terminal connected to the first input node and an output terminal connected to the output node 18. A second inductor $L_E$ is connected in series at the second input node 12, with an input terminal connected to the second input node 12 and an output terminal connected to the output node 18. A Chireix compensation inductor $L_{CHIR}$ is connected in shunt between the second input node 12 and ground. A Chireix compensation capacitor ($C_{CHIR}$) is connected in shunt between the first input node 10 and ground. A first capacitor $2C_E$ is connected in shunt between the output node 18 and ground.

The component values for the Chireix compensation elements are given by the formulas:

$$C_{CHIR} = \frac{\sin 2\theta_C}{q^2 \omega_0 2 R_E}$$

$$L_{CHIR} = \frac{2 R_E}{\omega_0 \sin 2\theta_C}$$

The other component values are the same as for the embodiment of the first aspect of the invention, described previously above.

In this embodiment, the signals from the 2 class-E power amplifiers are combined at the output lead of the module (output node 18), which is also the shunt capacitance node ($2C_E$). The Chireix compensation elements ($C_{CHIR}$ and $L_{CHIR}$) are placed in shunt to the input ports 10 and 12 of the class-E combiner. The only drawback is that $C_{CHIR}$ is effectively increasing the output capacitance of the first branch amplifier, degrading the class-E performance.

The implementation outlined in FIG. 5 shows the compensation capacitor connected by bond wires to the output of the power transistor 34 in the first branch amplifier. This output forms the first input node 10 of the combiner circuit and it is also connected by longer bond wires to the output lead 36. These longer bond wires form the first inductor $L_E$.

There is a similar structure in the second branch, where the output of the power transistor 34 is again connected to the output lead 36 by long bond wires, forming the second inductor $L_E$. The compensation inductor $L_{CHIR}$ is formed by a further set of bond wires connected to the output of the power transistor 34. Note that the compensation inductor $L_{CHIR}$ is not directly connected to ground. Instead, a capacitor $C_{DC}$ is placed to terminate the $L_{CHIR}$ bond wires. Including this capacitor $C_{DC}$ provides an RF short to ground and avoids creating a DC-short. ($C_{DC}$ is not shown in the circuit diagram of FIG. 1, because this is an AC diagram.)

To implement the correct shunt capacitance at the output node 18 an additional shunt capacitor is added next to the output lead 36 (connected to that lead by short bond wires) and tuned so that the total capacitance of the lead and the MOS capacitor is equal to $2C_E$.

Figure 6:
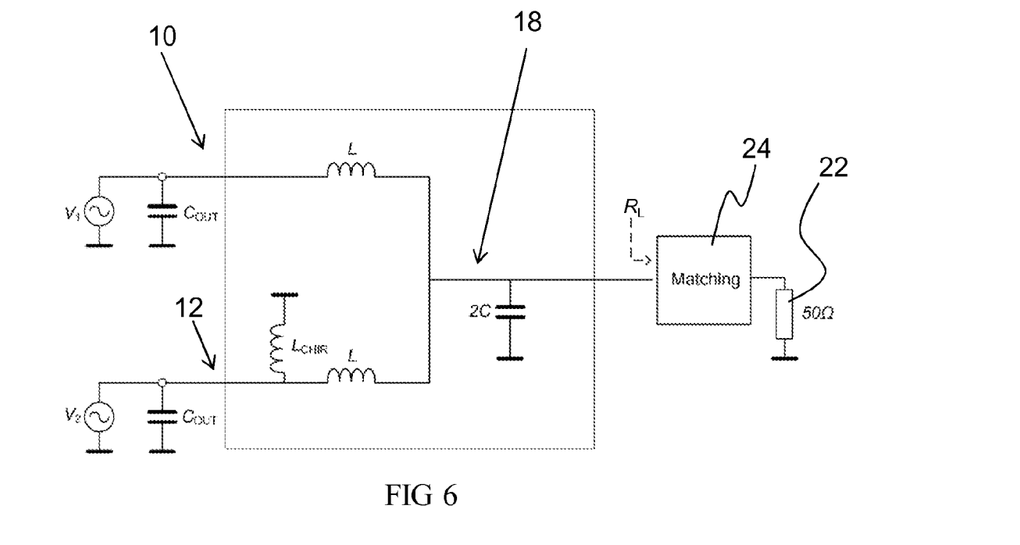
FIG. 6 is a circuit-diagram showing a combiner according to a second embodiment of the second aspect of the invention.
Figure 7:
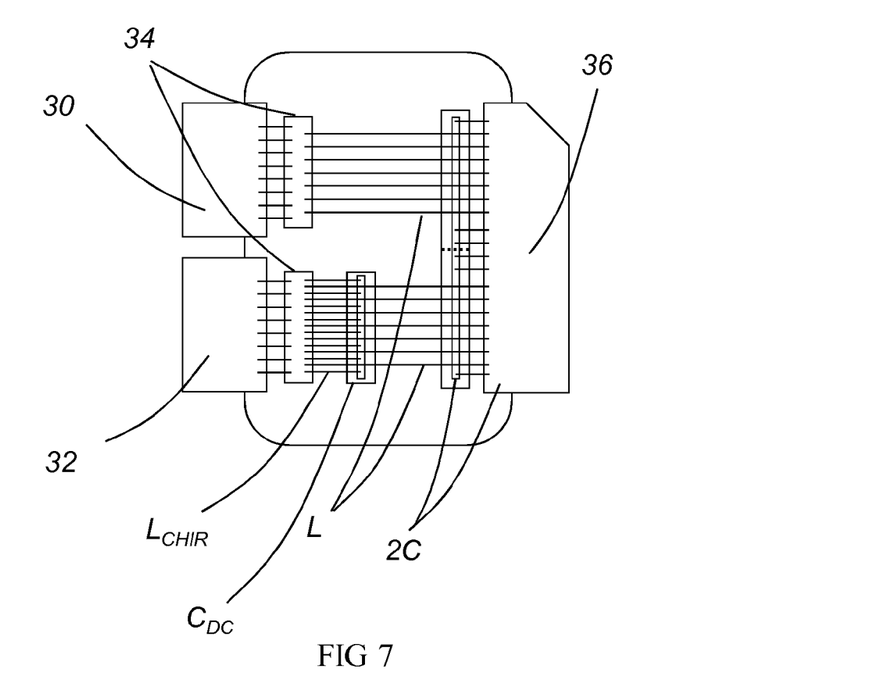
FIG. 7 is a schematic diagram illustrating a practical embodiment of the combiner of FIG. 6.

A second embodiment of the second aspect of the invention will now be described, with reference to FIGS. 6 and 7. FIG. 6 shows a circuit diagram and FIG. 7 shows a schematic diagram of a practical implementation. The basic underlying structure of this circuit is similar to that of the first embodiment of the second aspect. The only difference from the first embodiment is that the compensation capacitor $C_{CHIR}$ has been eliminated. Its function has instead been absorbed into the class-E combiner structure. This requires changes to the component values of the low-pass sections (which are changed from $L_E$ and $C_E$ to new values L and C) and a change to the value of the compensation inductor $L_{CHIR}$. Compared with the first embodiment, the bond wires that make the first and second inductors L are longer than those for the corresponding inductors $L_E$ in the first embodiment. In some implementations, this may mean that the first embodiment is easier to assemble and has higher yield than the second embodiment.

The component values in the second embodiment are as follows:

$$L = \frac{1}{\frac{1}{L_E} - \omega_0 \frac{\sin 2\theta_C}{2R_E}} \quad R_L = \frac{Z_0^2}{2R_E} \quad L_{CHIR} = \frac{R_E}{\omega_0 \sin 2\theta_C}$$

$$C = \frac{1}{\omega_0^2 L} \qquad Z_0 = \sqrt{\frac{L}{C}} \quad \theta_C = \arccos(10^{-B0/20})$$

Figure 8:
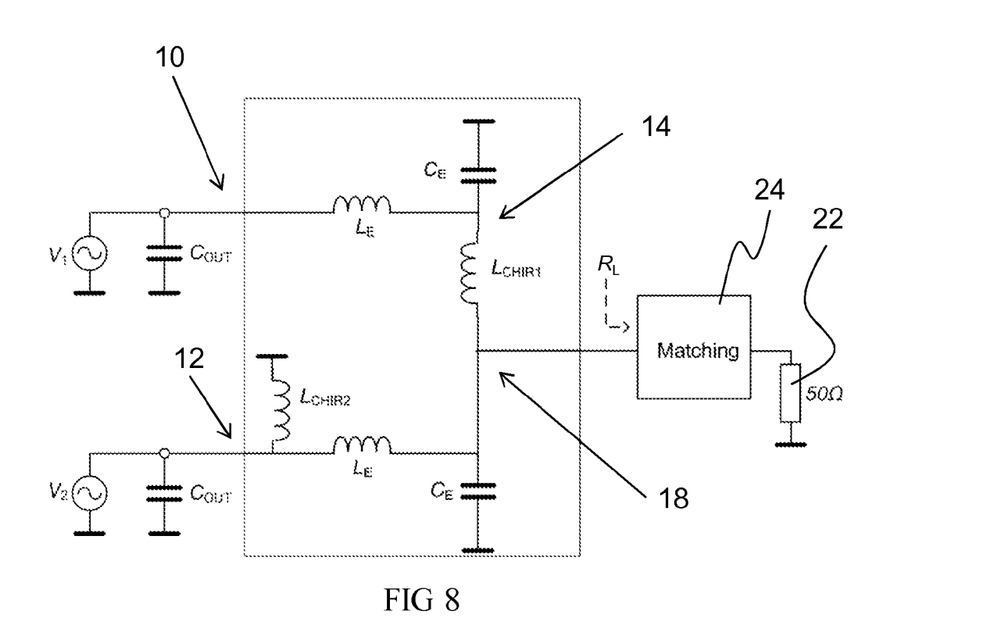
FIG. 8 is a circuit-diagram showing a combiner according to a third embodiment of the second aspect of the invention.
Figure 9:
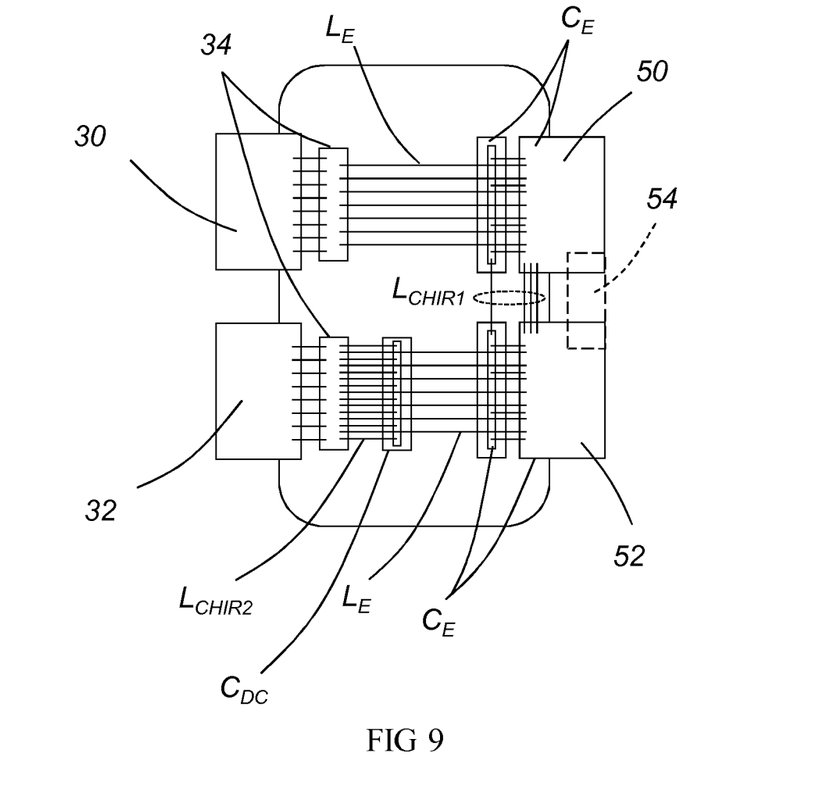
FIG. 9 is a schematic diagram illustrating a practical embodiment of the combiner of FIG. 8.

A third embodiment of the second aspect of the invention will now be described, with reference to FIGS. 8 and 9. FIG. 8 shows a circuit diagram and FIG. 9 shows a schematic diagram of a practical implementation. The underlying structure of this circuit is a hybrid of the first aspect of the invention and the second aspect. The first branch of the circuit (connected to the output of the first branch amplifier at the first input node 10) is identical to the first branch in FIG. 1 above. It includes a Chireix compensation inductor $L_{CHIR1}$ connected in series with the first inductor $L_E$, and the first capacitor $C_E$ connected in shunt at the output terminal of the first inductor $L_E$. The second branch of the circuit (connected to the output of the second branch amplifier) has a Chireix compensation inductor $L_{CHIR2}$ connected in shunt at the second input node 12. This gives the second branch a structure similar to the other embodiments of the second aspect, discussed above. Comparing the present embodiment with the first aspect of the invention, the Chireix compensation capacitor $C_{CHIR}$ of FIG. 1 is eliminated and instead replaced by the Chireix compensation inductor $L_{CHIR2}$ shown in FIG. 8.

The arrangement of FIG. 8 addresses a potential drawback of $C_{CHIR}$ in the first embodiment discussed above, wherein $C_{CHIR}$ increases the output capacitance of the first branch amplifier, degrading the class-E performance. At the same time, it also avoids the potential drawback of the long bond wires L in the second embodiment, by transforming $C_{CHIR}$ to the output (instead of simply absorbing it by adjusting the component values). This transformation results in the series inductance $L_{CHIR1}$. In this way, the low-pass section elements, $L_E$ and $C_E$, of the class-E amplifiers remain unchanged; however, these elements cannot be connected directly to a single output lead, because of the presence of the compensation inductor $L_{CHIR1}$. Instead, a dual input-lead, dual output-lead module is used for this purpose.

This package, schematically illustrated in FIG. 9, has two leads 50 and 52 on the output side. The first output lead 50 is equivalent to the output lead 40 of the package in FIG. 3. The second output lead 52 is connected to the second branch of the combiner circuit. In particular, it is connected to the second power transistor by bond wires which form the class-E inductor $L_E$. It is also connected by short bond wires to a discrete capacitor, whose value is chosen so that the combined capacitance of the capacitor and lead 52 is $C_E$. Similarly to the other embodiments of the second aspect (see FIGS. 5 and 7), the power transistor 34 in the second branch is connected to ground through a Chireix compensation inductor $L_{CHIR2}$ and an RF short capacitor $C_{DC}$.

The other Chireix compensation inductor $L_{CHIR1}$ can be implemented either inside or outside the package. Inside the package, it can be implemented by bond wires between the output leads 50 and 52 and/or between the two capacitors $C_E$. This group of bond wires is indicated by the dashed oval in FIG. 9. Outside the package the compensation inductor $L_{CHIR1}$ can be implemented with a track on the PCB, as indicated by the dashed rectangle 54 in FIG. 9.

The element values for the third embodiment are:

$$L_E = \frac{1}{\omega_0^2 q^2 C_{OUT}} \quad R_L = \frac{Z_{0E}^2}{2R_E} \quad L_{CHIR1} = \frac{R_L}{\omega_0}\sin 2\theta_C$$

$$C_E = \frac{1}{\omega_0^2 L_E} \quad Z_{0E} = \sqrt{\frac{L_E}{C_E}} \quad L_{CHIR2} = \frac{2R_E}{\omega_0 \sin 2\theta_C}$$

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A combiner circuit for a class-E outphasing power amplifier comprising first and second branch amplifiers, the combiner circuit comprising:
    a first input node, for receiving an output signal of the first branch amplifier;
    a second input node, for receiving an output signal of the second branch amplifier;
    an output node, for supplying a combined output signal to a load;
    a first inductor connected in series at the first input node, the first inductor having an input terminal connected to the first input node and an output terminal;
    a second inductor connected in series at the second input node, the second inductor having an input terminal connected to the second input node and an output terminal;
    a compensation inductor connected in series with the first inductor and directly connected to the output node;
    a compensation capacitor connected in series with the second inductor and directly connected to the output node;
    a first capacitor, with a first terminal connected to the output terminal of the first inductor and a second terminal connected to ground; and
    a second capacitor, with a first terminal connected the output terminal of the second inductor and a second terminal connected to ground;
    wherein the second capacitor and the compensation capacitor are implemented as Metal-Insulator-Metal capacitors together on a single die, and wherein each of the capacitors and/or inductors is implemented as a lumped element component.

2. The combiner circuit of claim 1, wherein:
    the compensation inductor is directly connected to the output terminal of the first inductor; and
    the compensation capacitor is directly connected to the output terminal of the second inductor.

3. The combiner circuit of claim 1, further comprising a connection at the output terminal of the second inductor for connecting a DC-bias supply.

4. The combiner circuit of claim 1, further comprising a matching circuit between the output node and the load.

5. A class-E outphasing power amplifier module, comprising:
    the combiner circuit of claim 1 in combination with the first and second branch amplifiers of claim 1, wherein the combiner circuit is arranged to combine the output signals of the first and second branch amplifiers.

6. A combiner circuit for a class-E outphasing power amplifier comprising first and second branch amplifiers, the combiner circuit comprising:
    a first input node, for receiving an output signal of the first branch amplifier;
    a second input node, for receiving an output signal of the second branch amplifier;
    an output node, for supplying a combined output signal to a load;
    a first inductor connected in series at the first input node, the first inductor having an input terminal connected to the first input node and an output terminal;
    a second inductor connected in series at the second input node, the second inductor having an input terminal connected to the second input node and an output terminal;
    a compensation inductor connected in shunt between the second input node and ground;
    a further compensation inductor connected in series with the first inductor and directly connected to the output node;
    a second capacitor, with a first terminal connected to the output terminal of the first inductor and a second terminal connected to ground; and
    wherein the further compensation inductor is directly connected to the output terminal of the first inductor, and wherein each of the capacitors and/or inductors is implemented as a lumped element component.

7. The combiner circuit of claim 6, further comprising a first capacitor connected in shunt between the output node and ground.

8. The combiner circuit of claim 6, further comprising a compensation capacitor connected in shunt between the first input node and ground.

9. The combiner circuit of claim 6, wherein:
    one or more of the capacitors are implemented as Metal-Oxide-Semiconductor capacitors; and/or
    one or more of the inductors are implemented as bond wires.

* * * * *